United States Patent
Jung et al.

(10) Patent No.: US 9,378,781 B1
(45) Date of Patent: Jun. 28, 2016

(54) SYSTEM, APPARATUS, AND METHOD FOR SENSE AMPLIFIERS

(71) Applicants: QUALCOMM Incorporated, San Diego, CA (US); Industry-Academic Cooperation Foundation; Yonsei University, Seoul (KR)

(72) Inventors: Seong-Ook Jung, Seoul (KR); Taehui Na, Seoul (KR); Jisu Kim, Seoul (KR); Jung Pill Kim, San Diego, CA (US); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/683,008

(22) Filed: Apr. 9, 2015

(51) Int. Cl.
*G11C 16/28* (2006.01)
*G11C 7/08* (2006.01)
*G11C 7/12* (2006.01)
*G11C 7/14* (2006.01)
*G11C 5/10* (2006.01)
*H03F 3/16* (2006.01)

(52) U.S. Cl.
CPC .. *G11C 7/08* (2013.01); *G11C 5/10* (2013.01); *G11C 7/12* (2013.01); *G11C 7/14* (2013.01); *H03F 3/16* (2013.01); *G11C 16/28* (2013.01); *H03F 2200/462* (2013.01); *H03F 2200/87* (2013.01)

(58) Field of Classification Search
CPC ..... G11C 16/28; G11C 16/26; G11C 11/5642

USPC .......... 365/185.21, 196, 207, 210.1
See application file for complete search history.

(56) References Cited

U.S. PATENT DOCUMENTS

| | | | |
|---|---|---|---|
| 6,728,152 B2 | 4/2004 | Van De Graaff et al. | |
| 8,605,528 B2 | 12/2013 | Barth, Jr. et al. | |
| 8,767,496 B2 | 7/2014 | McElroy et al. | |
| 2014/0269031 A1* | 9/2014 | Jung ................. | G11C 11/1673 365/158 |

OTHER PUBLICATIONS

Groeneveld S., et al., "Offset Correction Techniques for Voltage Sense Amplifiers," Aug. 2006, pp. 1-72.
Huang C.Y., et al., "High-voltage tolerant circuit design for fully CMOS compatible multiple-time programmable memories," IEEE International Symposium on Circuits and Systems (ISCAS), 2014, pp. 1949-1952.

* cited by examiner

*Primary Examiner* — Jason Lappas
(74) *Attorney, Agent, or Firm* — Muncy, Geissler, Olds & Lowe, P.C.

(57) ABSTRACT

An offset cancelling sense amplifier according to some examples of the disclosure may use a double sensing margin structure and positive feedback to achieve better performance characteristics and read stability without a multistage operation. For example, a sense amplifier may include a second pair of sensing switches cross coupled in parallel with a first pair of sensing switches and a pair of degeneration transistors coupled in line before a pair of load transistors.

26 Claims, 6 Drawing Sheets

SYSTEM, APPARATUS, AND METHOD FOR SENSE AMPLIFIERS

FIELD OF DISCLOSURE

This disclosure relates generally to sense amplifier circuits, and more specifically, but not exclusively, to current sampling sense amplifiers.

BACKGROUND

In conventional computer memory, a sense amplifier is one of the elements that make up the circuitry on a semiconductor memory chip (integrated circuit). A sense amplifier is part of the read circuitry that is used when data is read from the memory; its role is to sense the low power signals from a bitline that represents a data bit (1 or 0) stored in a memory cell, and amplify the small voltage swing or margin to recognizable logic levels so the data can be interpreted properly by logic outside the memory. Typical sense-amplifier circuits consist of two to six (usually four) transistors. Generally, there is one sense amplifier for each column of memory cells, so there may be hundreds or thousands of identical sense amplifiers on a modern memory chip.

In conventional sense amplifiers, however, the sensing margin is degraded with technology scaling due to a decrease in supply voltage, an increase in process variation, and limited sensing current to prevent read disturbances. To combat these problems, designers have turned to tighter magnetic tunnel junction (MTJ) resistance (RL and RH) distributions, higher TMR, or novel bit-cell structures (e.g., separated read and write paths). Unfortunately, these solutions have their own problems, such as poor sense margins and slow speeds along with issues in manufacturing process variations that result in widely varying performance of the circuits. In general, the degradation in the sensing margin is overcome by using offset-canceling circuits. However, these circuits have an inherent performance degradation because of the use of a multi-stage sensing operation.

Accordingly, there is a need for systems, apparatus, and methods that improve upon conventional approaches including the improved methods, system and apparatus provided hereby.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for a sense amplifier circuit for improving sensing margin and speed may include a pair of degeneration transistors, a gate of each of the pair of degeneration transistors being selectively coupled to a ground and a supply voltage; a pair of load transistors coupled to the pair of degeneration transistors; a pair of capacitors, each of the pair of capacitors being coupled to a drain of one of the pair of load transistors and a gate of the other of the pair of load transistors; a first pair of sensing switches, each of the first pair of sensing switches being coupled to the gate of one of the pair of load transistors and the drain of a same one of the pair of load transistors; a second pair of sensing switches, each of the second pair of sensing switches being coupled to the drain of one of the pair of load transistors; and a third pair of sensing switches configured in parallel with the first pair of sensing switches, each of the third pair of sensing switches being coupled to the drain of one of the pair of load transistors and cross coupled below an opposite one of the second pair of sensing switches.

Some examples of the disclosure are directed to systems, apparatus, and methods for a current sensing circuit for a memory cell having: a first degeneration transistor coupled to a bit line of a memory cell, the first degeneration transistor having a gate selectively coupled to a ground and a supply voltage; a second degeneration transistor coupled to a dummy bit line of the memory cell, the second degeneration transistor having a gate selectively coupled to a ground and the supply voltage; a first switch coupled to the bit line between the first degeneration transistor and the memory cell, the first switch configured to turn on the bit line; a second switch coupled to the dummy bit line between the second degeneration transistor and the memory cell, the second switch configured to turn on the dummy bit line; a third switch coupled to the bit line between the first degeneration transistor and the first switch and coupled to the dummy bit line between the second switch and the memory cell; and a fourth switch coupled to the dummy bit line between the second degeneration transistor and the second switch and coupled to the bit line between the first switch and the memory cell.

In some examples of the disclosure, the system, apparatus, and method includes sampling and amplifying a current in a read circuit of a memory cell by: closing a first switch in a bit line, a second switch in a dummy bit line, a third switch between the bit line and a gate of a first load transistor, and a fourth switch between the dummy bit line and a gate of a second load transistor; opening a fifth switch coupled to the bit line between the first switch and a drain of the first load transistor and coupled to the dummy bit line between the second switch and a memory cell; and opening a sixth switch coupled to the dummy bit line between the second switch and a drain of the second load transistor and coupled to the bit line between the first switch and the memory cell.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
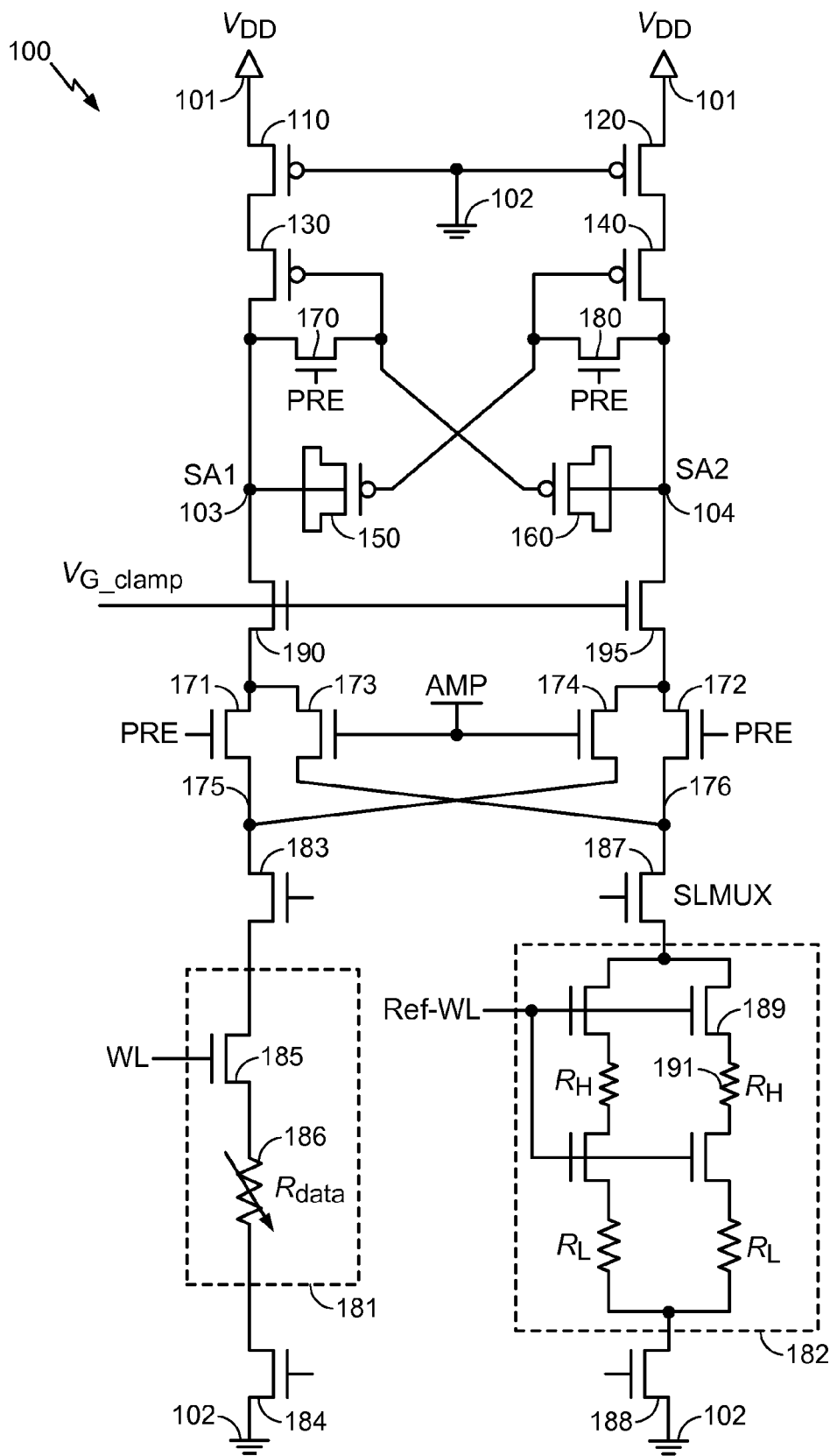
FIG. 1 illustrates an exemplary circuit diagram for a current sense amplifier coupled to a memory cell in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the long-felt industry needs, as well as other previously unidentified needs, and mitigate shortcomings of the conventional methods, apparatus, and systems.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

FIG. 1 illustrates an exemplary circuit diagram for a current sense amplifier coupled to a memory cell in accordance with some examples of the disclosure. As shown in FIG. 1, a sense amplifier circuit 100 may include a first degeneration transistor 110 coupled to a supply voltage 101, a second degeneration transistor 120 coupled to the supply voltage 101, a first load transistor 130 coupled to the first degeneration transistor 110, a second load transistor 140 coupled to the second degeneration transistor 120, a first capacitor 150 coupled to the second load transistor 140, a second capacitor 160 coupled to the first load transistor 130, a first switch 170 coupled to the first load transistor 130 and the second capacitor 160, a second switch 180 coupled to the second load transistor 140 and the first capacitor 150, a first clamp transistor 190 coupled to the first capacitor 150, and a second clamp transistor 195 coupled to the second capacitor 160.

The gates of the first degeneration transistor 110 and the second degeneration transistor 120 may be selectively coupled to a ground 102 and the supply voltage 101. The first degeneration transistor 110 and the second degeneration transistor 120 make the sense amplifier circuit 100 insensitive to supply voltage noise as well as process variations that make the transistors and other components of the sense amplifier circuit 100 vary from their ideal parameters, which may affect the operation of the sense amplifier circuit 100. The first capacitor 150 may be coupled between the drain of the first load transistor 130 and the gate of the second load transistor 140. The second capacitor 160 may be coupled between the drain of the second load transistor 140 and the gate of the first load transistor 130. The first capacitor 150 and the second capacitor 160 may be a p type metal-oxide-semiconductor capacitor (MOSCAP). A MOSCAP structure has a semiconductor substrate with a thin oxide layer and a top metal contact, referred to as the gate. A second metal layer forms an Ohmic contact to the back of the semiconductor and is called the bulk contact. The first degeneration transistor 110, the second degeneration transistor 120, the first load transistor 130, and the second load transistor 140 may be p-channel metal-oxide-semiconductor (PMOS) transistors. The first clamp transistor 190 and the second clamp transistor 195 may be n-channel metal-oxide-semiconductor (NMOS) transistors. In addition, a first sense amplifier node (SA1) 103 may be located at a point between the first capacitor 150 and the drain of the first load transistor 130. A second sense amplifier node (SA2) 104 may be located at a point between the second capacitor 160 and the drain of the second load transistor 140.

The sense amplifier circuit 100 may also include a third switch 171 coupled to the first clamp transistor 190, a fourth switch 172 coupled to the second clamp transistor 195, a fifth switch 173 coupled between the first clamp transistor 190 and the fourth switch 172, and a sixth switch 174 coupled between the second clamp transistor 195 and the third switch 171. The third switch 171 is configured in parallel with the fifth switch 173 and the fourth switch 172 is configured in parallel with the sixth switch 174 such that the third switch 171 opens a path along a bit line 175 to a data cell 181, the fourth switch 172 opens a path along a dummy bit line 176 to a reference cell 182, the fifth switch 173 opens a path from the bit line 175 to the dummy bit line 176, and the sixth switch 174 opens a path from the dummy bit line 176 to the bit line 175. The fifth switch 173 and the sixth switch 174 improve the performance, such as speed, of the sense amplifier circuit 100 and increase the sensing margins of the sense simplifier circuit 100 significantly.

The data cell 181 is coupled to the bit line 175 through a first select switch 183 and to ground 102 through a data cell switch 184. The data cell 181 is configured to store data and may include a word line switch 185 in series with a data load 186. The reference cell 182 is coupled to the dummy bit line 176 through a second select switch 187 and to ground 102 through a reference cell switch 188. The reference cell is configured to provide a reference for the data cell 181 and may include a reference word line switch arrangement 189 in series with a reference load arrangement 191.

Figure 2:
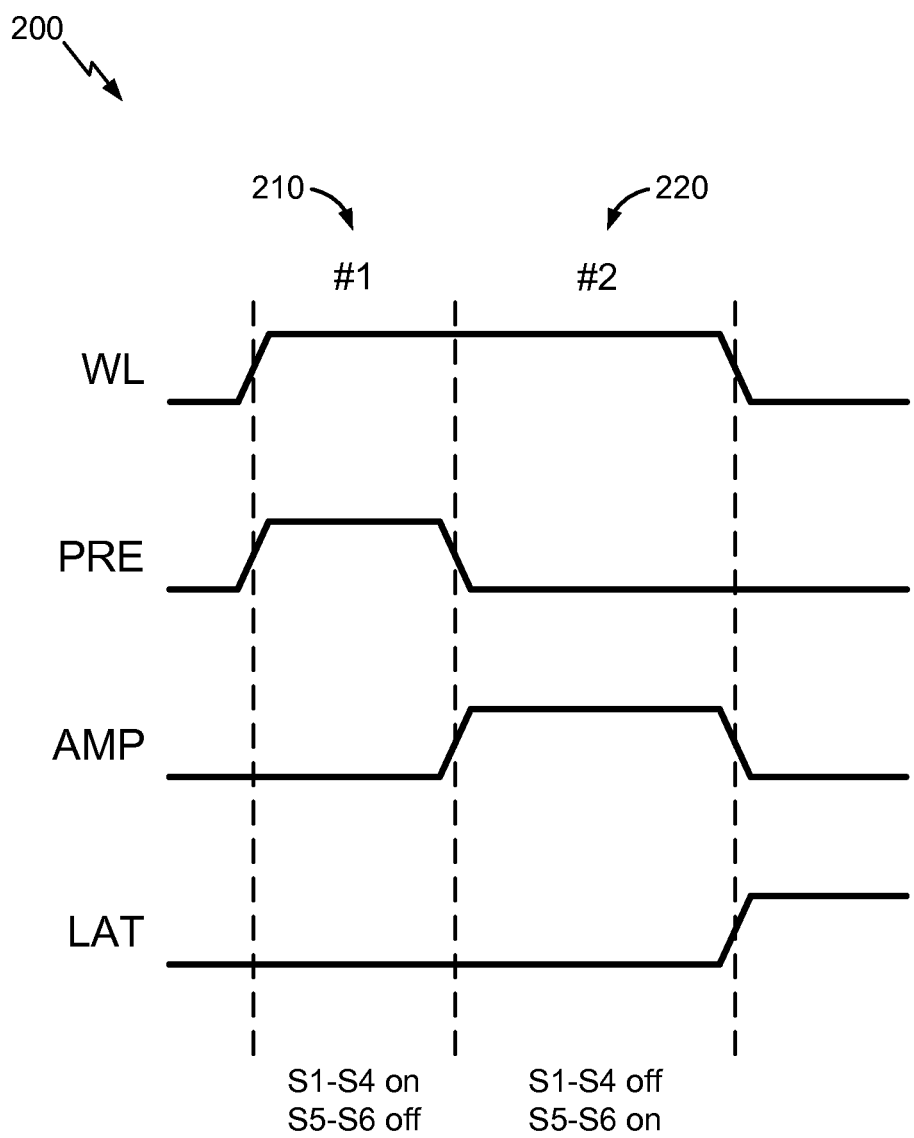
FIG. 2 illustrates an exemplary timing diagram for a current sense amplifier in accordance with some examples of the disclosure.

FIG. 2 illustrates an exemplary timing diagram 200 for a current sense amplifier in accordance with some examples of the disclosure. As shown in FIG. 2, an operation of a sense amplifier circuit, such as sense amplifier circuit 100, includes two phases, phase 210 (#1) and phase 220 (#2). The phase 210 is the pre-charge and current sampling phase of operation and the phase 220 is the amplification phase of the operation. At the beginning of phase 210, the first switch 170, the second switch 180, third switch 171, and fourth switch 172 are turned on while the fifth switch 173 and the sixth switch 174 are turned off. At the same time, the word line is shifted to a logical high value thus closing the word line switch 185 and the arrangement of reference word line switches 189. At the beginning of phase 220, the first switch 170, the second switch 180, third switch 171, and fourth switch 172 are turned off while the fifth switch 173 and the sixth switch 174 are turned on. At the same time, the word line is kept at a logical high value keeping the word line switch 185 and the arrangement of reference word line switches 189 closed. At the end of phase 220, the word line is shifted to a logical low value while the first clamp transistor 190 and the second clamp transistor 195 are engaged to hold those nodes at a logical high value.

Figure 3:
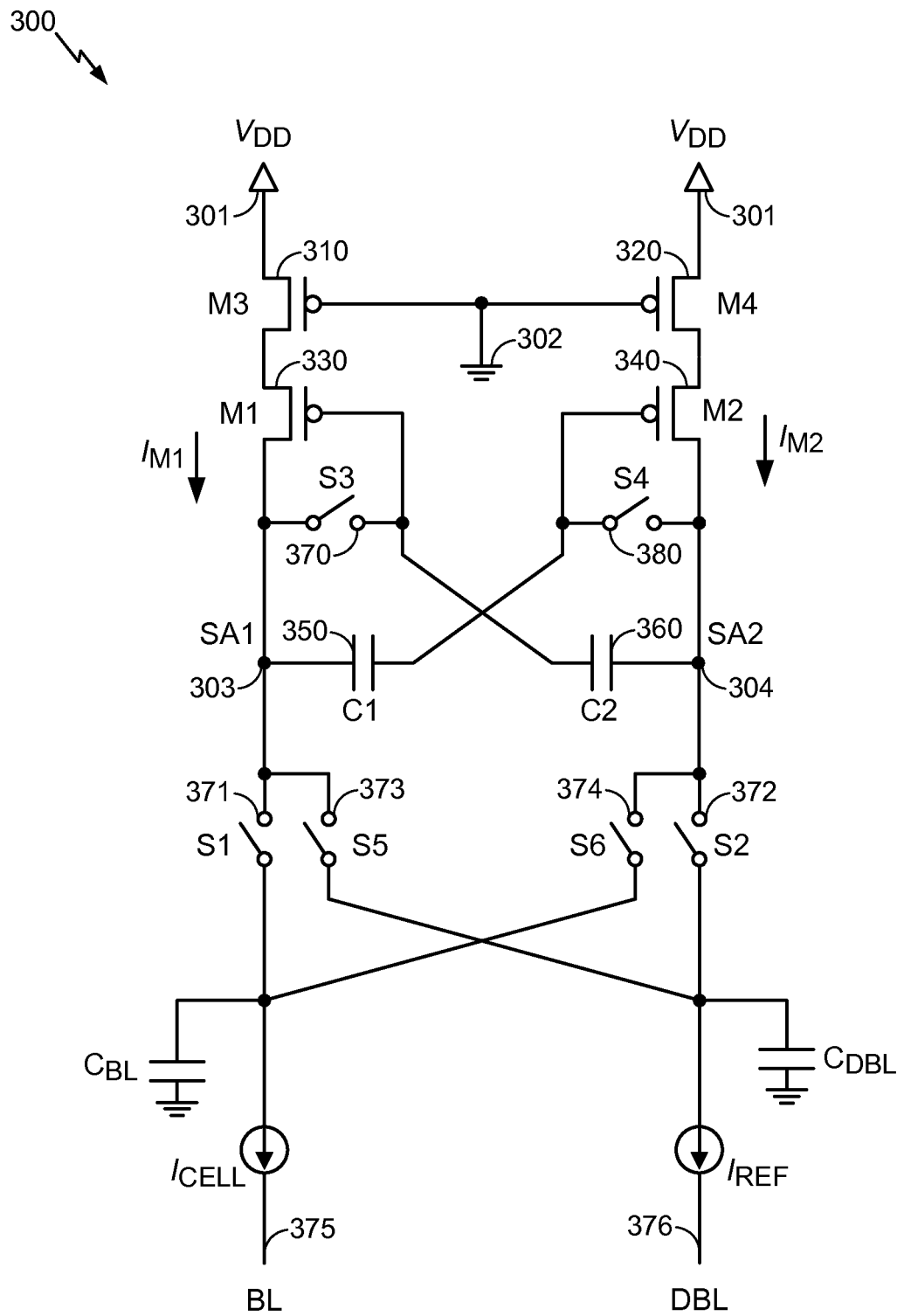
FIG. 3 illustrates an exemplary circuit diagram for a sense amplifier in accordance with some examples of the disclosure.

FIG. 3 illustrates an exemplary circuit diagram for a sense amplifier in accordance with some examples of the disclosure. As shown in FIG. 3, a sense amplifier circuit 300 may include a first degeneration transistor (M3) 310 coupled to a supply voltage ($V_{DD}$) 301, a second degeneration transistor (M4) 320 coupled to the supply voltage 301, a first load transistor (M1) 330 coupled to the first degeneration transistor 310, a second load transistor (M2) 340 coupled to the second degeneration transistor 320, a first capacitor (C1) 350 coupled to the second load transistor (M2) 340, a second capacitor (C2) 360 coupled to the first load transistor 330, a first switch (S3) 370 coupled to the first load transistor 330 and the second capacitor 360, and a second switch (S4) 380 coupled to the second load transistor 340 and the first capacitor 350.

The gates of the first degeneration transistor 310 and the second degeneration transistor 320 may be selectively coupled to a ground 302 and the supply voltage 301. The first degeneration transistor 310 and the second degeneration transistor 320 make the sense amplifier circuit 300 insensitive to supply voltage noise as well as process variations that make the transistors and other components of the sense amplifier circuit 300 vary from their ideal parameters, which may affect the operation of the sense amplifier circuit 300. The first capacitor 350 may be coupled between the drain of the first load transistor 330 and the gate of the second load transistor 340. The second capacitor 360 may be coupled between the drain of the second load transistor 340 and the gate of the first load transistor 330. The first capacitor 350 and the second capacitor 360 may be p type MOSCAPs. The first degeneration transistor 310, the second degeneration transistor 320, the first load transistor 330, and the second load transistor 340 may be p-channel metal-oxide-semiconductor (PMOS) transistors. The first clamp transistor 390 and the second clamp transistor 395 may be n-channel metal-oxide-semiconductor (NMOS) transistors. In addition, a first sense amplifier node (SA1) 303 may be located at a point between the first capacitor 350 and the drain of the first load transistor 330. A second sense amplifier node (SA2) 304 may be located at a point between the second capacitor 360 and the drain of the second load transistor 340.

The sense amplifier circuit 300 may also include a third switch 371 coupled to the first load transistor 330, the first switch 370, and the first capacitor 350; a fourth switch 372 coupled to the second load transistor 340, the second switch 380, and the second capacitor 360; a fifth switch 373 coupled between the first load transistor 330 and the fourth switch 372; and a sixth switch 374 coupled between the second load transistor 340 and the third switch 371. The third switch 371 is configured in parallel with the fifth switch 373 and the fourth switch 372 is configured in parallel with the sixth switch 374 such that the third switch 371 opens a path along a bit line 375 to a memory cell (not shown), the fourth switch 372 opens a path along a dummy bit line 376 to a reference cell (not shown), the fifth switch 373 opens a path from the bit line 375 to the dummy bit line 376, and the sixth switch 374 opens a path from the dummy bit line 376 to the bit line 375. The fifth switch 373 and the sixth switch 374 improve the performance, such as speed, of the sense amplifier circuit 300 and increase the sensing margins of the sense simplifier circuit 300 significantly. The sense amplifier circuit 300 operates in two phases, the first phase 410 is the bit line pre-charge and current sampling phase (see FIG. 4). The second phase 420 is the amplification phase (see FIG. 5).

Figure 4:
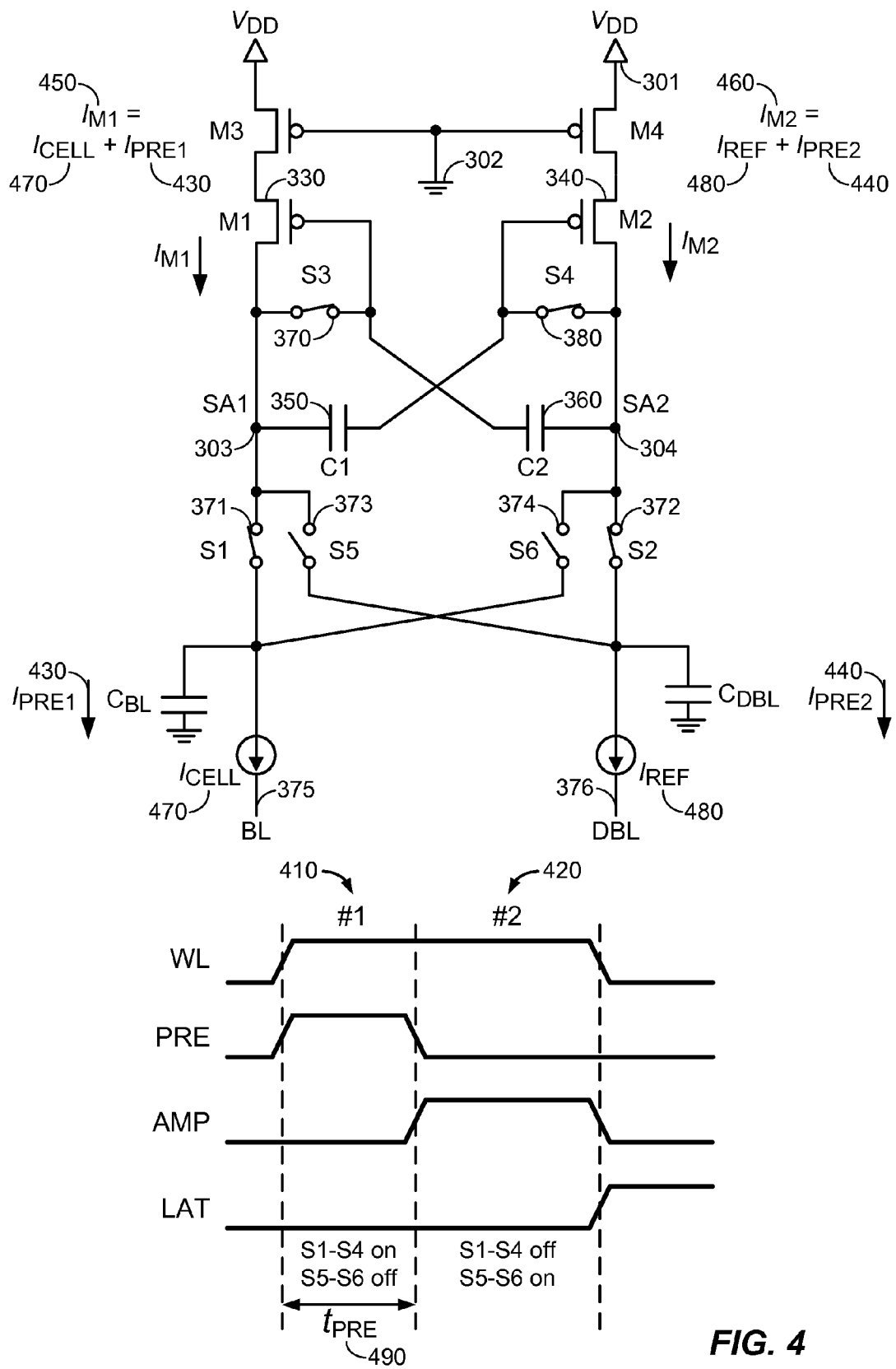
FIG. 4 illustrates an exemplary sense amplifier and timing diagram in accordance with some examples of the disclosure.

FIG. 4 illustrates an exemplary sense amplifier and timing diagram in accordance with some examples of the disclosure during a first phase 410 of operation. As shown in FIG. 4, the first phase 410 of operation of the sense amplifier circuit 300 may include bit line 375 and dummy bit line 376 pre-charging and current sampling at nodes 303 and 304. At the beginning of the first phase 410, the first switch 370, the second switch 380, the third switch 371, and the fourth switch 372 are turned on (S1-S4). Then, the first load transistor 330 and the second load transistor 340 (M1 and M2), which may be diode-connected, provide a large first pre-charge current 430 ($I_{PRE1}$) to the bit line 375 (BL) and a large second pre-charge current 440 ($I_{PRE2}$) to the dummy bit line 376 (DBL). In this point in the operation, the first load current 450 ($I_{M1}$) and second load current 460 ($I_{M2}$) are equal to a data cell current 470 ($I_{CELL}$)+ the first pre-charge current 430 ($I_{PRE1}$) and a reference current 480 ($I_{REF}$)+the second pre-charge current 440 ($I_{PRE2}$), respectively.

After a sufficient pre-charge time 490 ($I_{PRE}$), the pre-charge operation of the bit line 375 (BL) and the dummy bit line 376 (DBL) is finished. This will force the first pre-charge current 430 ($I_{PRE1}$) and the second pre-charge current 440 ($I_{PRE2}$) to be 0. Then, the first load current 450 ($I_{M1}$) and the second load current 460 ($I_{M2}$) become the data cell current 470 ($I_{CELL}$) and the reference current 480 ($I_{REF}$), respectively, resulting in the saturation of voltages at node 303 (SA1=$V_{SA1}$) and node 404 (SA2=$V_{SA2}$). It should be understood that the first load current 450 ($I_{M1}$) and the second load current 460 ($I_{M2}$) become the data cell current 470 ($I_{CELL}$) and the reference current 480 ($T_{REF}$), respectively, regardless of manufacturing induced variations in the parameters of the first load transistor 330 and the second load transistor 340 (M1 and M2). At the end of the first phase 410 of operation, the first load current 450 ($I_{M1}$) and the second load current 460 ($I_{M2}$) are sampled by storing $V_{SA1}$ and $V_{SA2}$ using the second capacitor 360 and the first capacitor 350, respectively.

Figure 5:
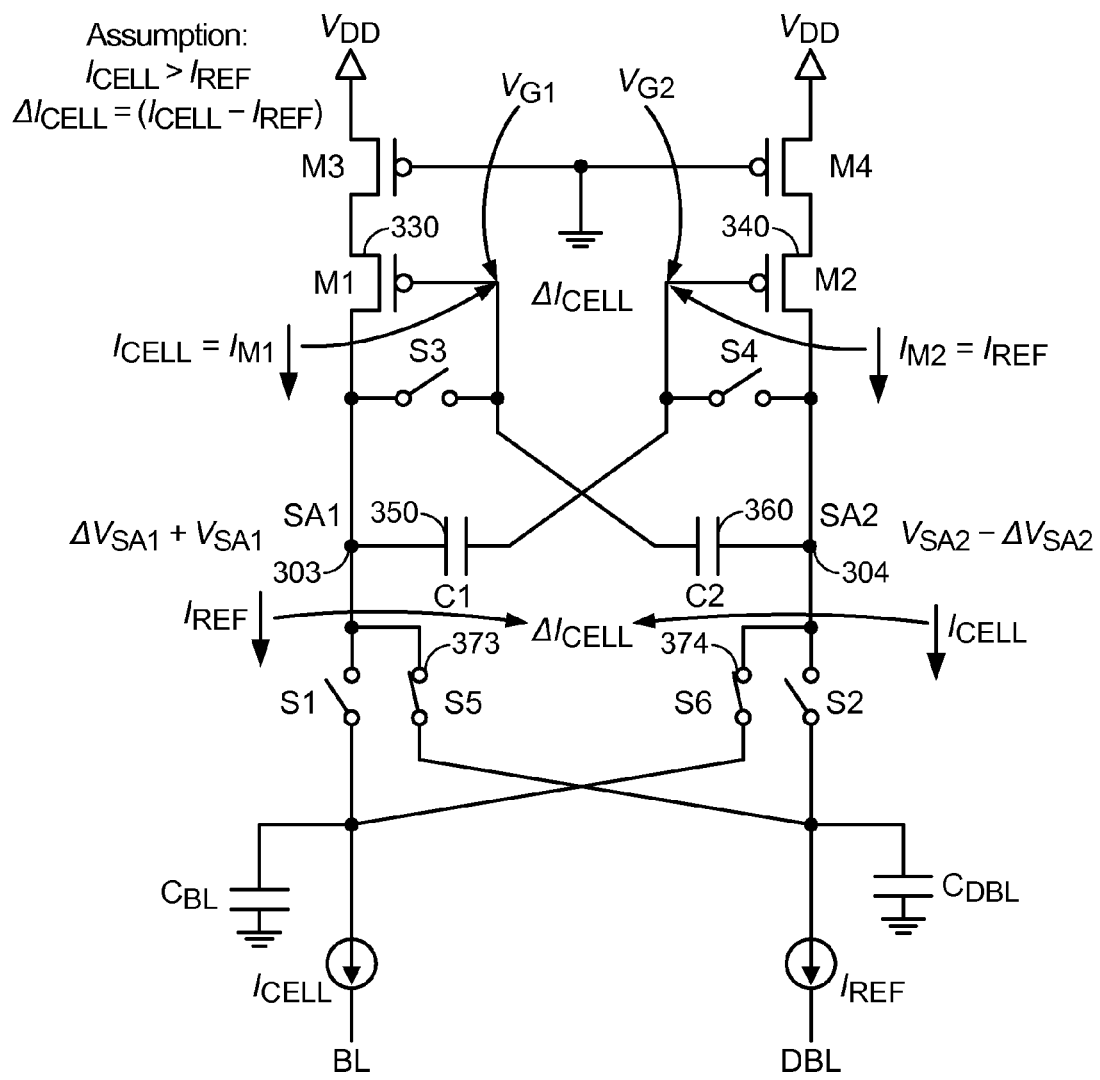
FIG. 5 illustrates an exemplary sense amplifier and timing diagram in accordance with some examples of the disclosure.

FIG. 5 illustrates an exemplary sense amplifier and timing diagram in accordance with some examples of the disclosure during a second phase 420 of operation. As shown in FIG. 5, the second phase 420 of operation of the sense amplifier circuit 300 may include amplification using a double sensing margin structure and a strong positive feedback. At the beginning of the second phase 420, the first switch 370, the second switch 380, the third switch 371, and the fourth switch 372 are turned off (S1-S4), but the fifth switch 373 and sixth switch 374 (S5 and S6) are turned on. Then, the first load transistor 330 (M1) and the second load transistor 340 (M2) charges to the node 303 (SA1) and node 304 (SA2) with the sampled first load current 450 ($I_{M1}$) and the second load current 460 ($I_{M2}$). At the same time, the fifth switch 373 (S5) and sixth switch 374 (S6) discharge the node 303 (SA1) and node 304 (SA2) node with the current (the reference current 480 ($I_{REF}$)/the data cell current 470 ($I_{CEL}$)). Thus, total current difference between SA1 303 and SA2 304 nodes becomes twice ($\Delta I_{SA}=2*\Delta I_{CELL}$) that of the change in the data cell current 470 ($I_{CELL}$). In one scenario, if the data cell current 470 ($I_{CELL}$) is greater than the reference current 480 ($I_{REF}$), $V_{SA1}$ increases and $V_{SA2}$ decreases due to the difference between charging and discharging currents. Thus, the fifth switch 373 and the sixth switch 374 configured in parallel allow a two fold increase in sensing margin. The strong positive feedback is due to the AC-coupling behavior of the first capacitor 350 (C1) and the second capacitor 360 (C2), the change in the voltage at node 303 ($\Delta V_{SA1}$) increases the gate voltage of the second load transistor 340 ($V_{G2}$), leading to the decrease in overdrive voltage of the second load transistor 340 ($V_{OV2}=V_{SG2}-V_{TH2}$). This reduction if overdrive voltage cause the load current ($I_{M2}$ and $I_{M1}$) to decrease by $\Delta I_{M2}$ and $\Delta I_{M1}$ respectively. Contrary to this result, the change in voltage at node 304 ($-\Delta V_{SA2}$) decreases the gate voltage of the second load transistor ($V_{G2}$), leading to the increase in the overdrive voltage of the first load transistor 330 ($V_{OV1}=V_{SG1}-V_{TH1}$). For this reason, $V_{SA1}$ increases and $V_{SA2}$ decreases repeatedly. Because of this strong positive feedback, $V_{SA1}/V_{SA2}$ becomes almost rail-to-rail voltage very quickly. As described, offset cancelation may be accomplished without going through a multi-stage operation, a double sensing margin structure is created by virtue of the fifth switch 373 (S5) and the sixth switch (S6), a higher speed performance over conventional circuits is obtained by virtue of strong positive feedback, and a higher read stability is achieved by virtue of the double sensing margin structure and the positive feedback.

Figure 6:
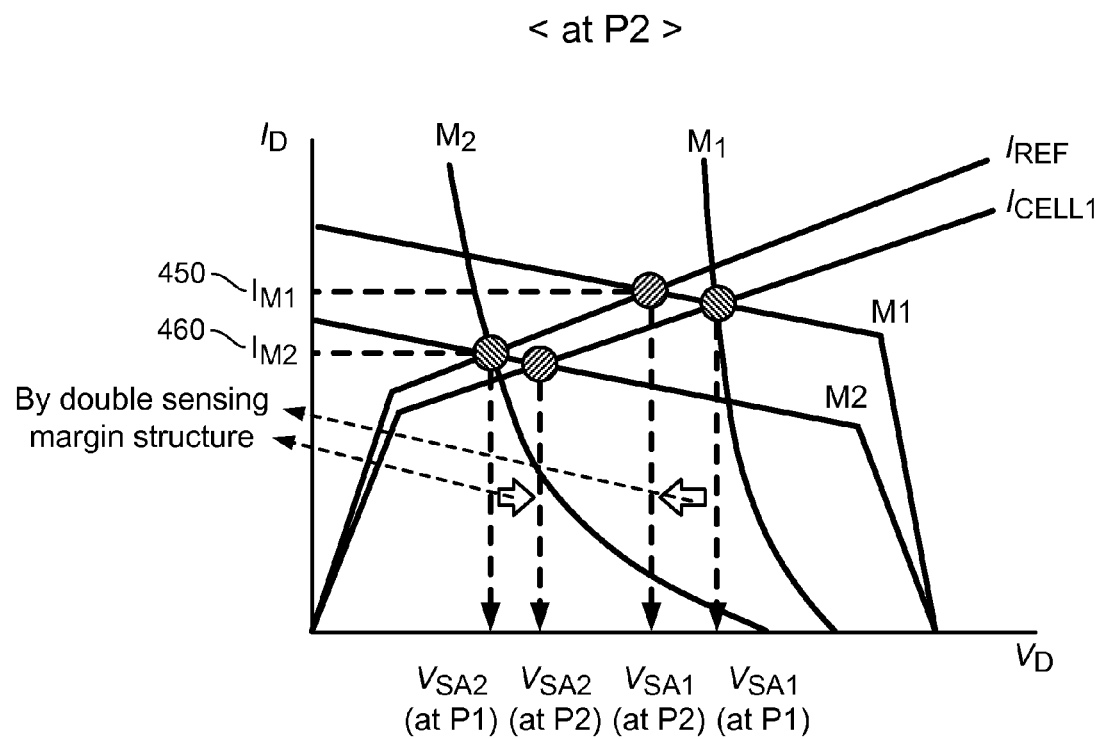
FIG. 6 illustrates an exemplary graph of drain current versus voltage for a sense amplifier in accordance with some examples of the disclosure.

FIG. 6 illustrates an exemplary graph of drain current versus voltage for a sense amplifier in accordance with some examples of the disclosure. As shown in FIG. 6, even though the first load current 450 ($I_{M1}$) may be greater than the second load current 460 ($I_{M2}$) due to uncontrollable manufacturing process variations in the first phase 410 (P1), the voltage at node 303 ($V_{SA1}$) decreases and the voltage at node 304 ($V_{SA2}$) increases due to the double sensing margin structure and the voltage at node 303 ($V_{SA1}$) keeps decreasing down to ground (GND) and the voltage at node 304 ($V_{SA2}$) keeps increasing up to almost the supply voltage 301 ($V_{DD}$) by the positive feedback. Thus, even though the current sampling is incorrect, the sense amplifier circuit 300 can sense correctly. In other words, as long as the reference current 480 ($I_{REF}$) and the data cell current 470 ($I_{CELL}$) are not flipped due to the process variation, the sense amplifier circuit 300 can sense correctly regardless of the process variation.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Although some aspects have been described in connection with a circuit, it goes without saying that these aspects also constitute a description of the corresponding method, and so a block or a component of a circuit should also be understood as a corresponding method step or as a feature of a method step. Analogously thereto, aspects described in connection with or as a method step also constitute a description of a corresponding block or detail or feature of a corresponding circuit.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A sense amplifier circuit for improving sensing margin and speed, comprising:
   a pair of degeneration transistors, a gate of each of the pair of degeneration transistors being selectively coupled to a ground and a supply voltage;
   a pair of load transistors coupled to the pair of degeneration transistors;
   a pair of capacitors, each of the pair of capacitors being coupled to a drain of one of the pair of load transistors and a gate of the other of the pair of load transistors;
   a first pair of sensing switches, each of the first pair of sensing switches being coupled to the gate of one of the pair of load transistors and the drain of a same one of the pair of load transistors;
   a second pair of sensing switches, each of the second pair of sensing switches being coupled to the drain of one of the pair of load transistors; and
   a third pair of sensing switches configured in parallel with the second pair of sensing switches, each of the third pair of sensing switches being coupled to the drain of one of the pair of load transistors and cross coupled below an opposite one of the second pair of sensing switches.

2. The sense amplifier circuit of claim 1, further comprising a pair of clamp transistors, each of the pair of clamp transistors being coupled to the drain of one of the pair of load transistors.

3. The sense amplifier circuit of claim 2, wherein the pair of clamp transistors are n-channel metal-oxide-semiconductor (NMOS) transistors.

4. The sense amplifier circuit of claim 2, wherein the pair of degeneration transistors are p-channel metal-oxide-semiconductor (PMOS) transistors.

5. The sense amplifier circuit of claim 2, wherein the pair of load transistors are p-channel metal-oxide-semiconductor (PMOS) transistors.

6. The sense amplifier circuit of claim 2, wherein in the pair of capacitors are p type metal-oxide-semiconductor capacitors (MOSCAPs).

7. The sense amplifier circuit of claim 2, wherein the second pair of sensing switches and the third pair of sensing switches are coupled to a bit line for a memory cell and a dummy bit line for a reference cell.

8. The sense amplifier of claim 7, wherein the sense amplifier circuit is incorporated into a device selected from a group consisting of a set top box, a music player, a video player, an entertainment unit, a navigation device, a communications device, a personal digital assistant (PDA), a fixed location data unit, and a computer, and further including the device.

9. A current sensing circuit for a memory cell, comprising:
   a first degeneration transistor coupled to a bit line of a memory cell, the first degeneration transistor having a gate selectively coupled to a ground and a supply voltage;
   a second degeneration transistor coupled to a dummy bit line of the memory cell, the second degeneration transistor having a gate selectively coupled to a ground and the supply voltage;
   a first switch coupled to the bit line between the first degeneration transistor and the memory cell, the first switch configured to turn on the bit line;
   a second switch coupled to the dummy bit line between the second degeneration transistor and the memory cell, the second switch configured to turn on the dummy bit line;
   a third switch coupled to the bit line between the first degeneration transistor and the first switch and coupled to the dummy bit line between the second switch and the memory cell; and
   a fourth switch coupled to the dummy bit line between the second degeneration transistor and the second switch and coupled to the bit line between the first switch and the memory cell.

10. The current sensing circuit of claim 9, further comprising:
    a first load transistor coupled to the bit line between the first degeneration transistor and the first switch; and
    a second load transistor coupled to the dummy bit line between the second degeneration transistor and the second switch.

11. The current sensing circuit of claim 10, further comprising:
    a first capacitor coupled to the bit line between the first load transistor and the first switch and coupled to a gate of the second load transistor; and
    a second capacitor coupled to the dummy bit line between the second load transistor and the second switch and coupled to a gate of the first load transistor.

12. The current sensing circuit of claim 11, further comprising:
    a fifth switch coupled to the bit line between the first load transistor and the first switch and coupled between the gate of the first load transistor and the second capacitor; and
    a sixth switch coupled to the dummy bit line between the second load transistor and the second switch and coupled between the gate of the second load transistor and the first capacitor.

13. The current sensing circuit of claim 12, further comprising:
    a first clamp transistor coupled to the bit line between the first load transistor and the first switch; and
    a second clamp transistor coupled to the dummy bit line between the second load transistor and the second switch.

14. The current sensing circuit of claim 13, wherein the first clamp transistor and the second clamp transistor are n-channel metal-oxide-semiconductor (NMOS) transistors.

15. The current sensing circuit of claim 13, wherein the first degeneration transistor and the second degeneration transistor are p-channel metal-oxide-semiconductor (PMOS) transistors.

16. The current sensing circuit of claim 13, wherein the first load transistor and the second load transistor are p-channel metal-oxide-semiconductor (PMOS) transistors.

17. The current sensing circuit of claim 13, wherein the first capacitor and the second capacitor are p type metal-oxide-semiconductor capacitors (MOSCAPs).

18. The current sensing circuit of claim 13, wherein the bit line is coupled to a supply voltage before the first degeneration transistor and the memory cell after the first switch.

19. The current sensing circuit of claim 13, wherein the dummy bit line is coupled to a supply voltage before the second degeneration transistor and a reference cell after the second switch.

20. The current sensing circuit of claim 13, wherein the current sensing circuit is incorporated into a device selected from a group consisting of a set top box, a music player, a video player, an entertainment unit, a navigation device, a communications device, a personal digital assistant (PDA), a fixed location data unit, and a computer, and further including the device.

21. A method for sampling and amplifying a current in a read circuit of a memory cell, the method comprising:
- closing a first switch in a bit line, a second switch in a dummy bit line, a third switch between the bit line and a gate of a first load transistor, and a fourth switch between the dummy bit line and a gate of a second load transistor;
- opening a fifth switch coupled to the bit line between the first switch and a drain of the first load transistor and coupled to the dummy bit line between the second switch and a memory cell; and
- opening a sixth switch coupled to the dummy bit line between the second switch and a drain of the second load transistor and coupled to the bit line between the first switch and the memory cell.

22. The method for sampling and amplifying a current of claim 21, further comprising:
- providing, by the first load transistor, a first pre-charge current to the bit line; and
- providing, by the second load transistor, a second pre-charge current to the dummy bit line.

23. The method for sampling and amplifying a current of claim 22, further comprising:
- opening, after a pre-charge time, the first switch, the second switch, the third switch, and the fourth switch; and
- closing, after the pre-charge time, the fifth switch and the sixth switch.

24. The method for sampling and amplifying a current of claim 23, further comprising:
- sampling, at the first load transistor, a first load current; and
- sampling, at the second load transistor, a second load current.

25. The method for sampling and amplifying a current of claim 24, further comprising:
- amplifying a current difference between the first load current and the second load current; and
- increasing a gate voltage of the second load transistor in response to the amplified current difference.

26. The method for sampling and amplifying a current of claim 24, further comprising:
- amplifying a current difference between the first load current and the second load current; and
- decreasing a gate voltage of the second load transistor in response to the amplified current difference.

* * * * *